United States Patent

Sporck et al.

[11] Patent Number: 5,867,033
[45] Date of Patent: Feb. 2, 1999

[54] CIRCUIT FOR TESTING THE OPERATION OF A SEMICONDUCTOR DEVICE

[75] Inventors: A. Nicholas Sporck, Saratoga, Calif.; Paul D. Torgerson, Inver Grove Heights, Minn.; Roy J. Henson, Cupertino, Calif.

[73] Assignee: LSI Logic Corporation, Millpitas, Calif.

[21] Appl. No.: 653,321

[22] Filed: May 24, 1996

[51] Int. Cl.⁶ .............................. G01R 31/26; H03K 5/13
[52] U.S. Cl. ............................ 324/763; 324/766; 438/18
[58] Field of Search ................................ 324/763, 765, 324/766; 257/48; 438/17, 18

[56] References Cited

U.S. PATENT DOCUMENTS

| | | | |
|---|---|---|---|
| 5,068,547 | 11/1991 | Gascoyne | 307/443 |
| 5,631,596 | 5/1997 | Sporck et al. | 327/378 |
| 5,760,599 | 6/1998 | Ehiro | 324/765 |

*Primary Examiner*—Glenn W. Brown

[57] ABSTRACT

A circuit for testing a semiconductor device, which has an oscillator for producing pulses when energized. A control circuit receives a test signal, a clock signal having pulses, and a reset signal, and energizes the oscillator for a predetermined length of time in response to the test signal. A counter detects the pulses produced by the oscillator, and produces counter signals which indicate the number of pulses detected by the counter. An output detector receives the counter signals and produces an output signal when the counter signals indicate that the number of pulses detected is equal to a predetermined number. However, the number of pulses produced by the oscillator during the predetermined length of time is preferably less than the predetermined number. The control circuit provides the clock signal to the counter after the predetermined length of time, until the output of the output detector indicates that the predetermined number of pulses has been detected. The control circuit resets the counter in response to the reset signal.

29 Claims, 2 Drawing Sheets

CIRCUIT FOR TESTING THE OPERATION OF A SEMICONDUCTOR DEVICE

FIELD OF THE INVENTION

This invention relates to the field of semiconductor device manufacturing. More particularly the invention relates to the field of digital circuits for monitoring semiconductor device manufacturing processes.

BACKGROUND OF THE INVENTION

Process monitor circuits are used in semiconductor manufacturing processes to monitor, at various points during production, whether the processes are producing semiconductor devices that perform according to specification. Monitoring is typically done by measuring the characteristics of the monitor circuit that are related to the process conditions used to fabricate the circuit. The process monitor circuits may be placed within every one of the production circuits, or dice, produced. In this manner, the process monitor circuit in each packaged device can be used as a data point to determine process characteristics.

This design goal has been more difficult to achieve as processing technology has advanced, and semiconductor devices operate at increasingly greater speeds. This is because the size of certain process monitor circuits has needed to increase as the speed of the semiconductor devices has increased. Increasing the size of the process monitor requires the production dice to be larger. Making the production dice larger is contrary to general design goals, as it results in a more expensive device.

For example, one important process monitor for CMOS circuitry is the speed at which the gate can switch. Thus, a typical process monitor circuit designed to measure gate speed might have two signal paths. One of the paths is designed to transmit a signal quickly, and the other is designed to transmit a signal with a delay that is proportional to the gate switching speed. Customarily, several transistors may be connected in series for the delayed signal path. The difference in the length of time required for the signal to traverse the quick path and the delayed path gives an indication of the speed of the transistor gates.

However, as gate switching speeds have increased, the difference between the times required for the signals to traverse the two paths has decreased to the point that automated test equipment cannot conveniently and accurately measure the difference. Thus, additional transistors are placed in series in the delayed signal path, increasing the amount of time required by the signal traversing the path. Therefore, as device speeds increase, more and more transistors are added to the circuit so that it can be accurately tested. The additional transistors require additional surface area in the production dice.

Adding to the problem is the desired capability to take multiple, independent measurements on process monitor circuits. For instance, it is beneficial to have independent measurements for both PMOS gates and NMOS gates in the example given above. Adding such capability, however, has typically compounded the problem of size limitations and resulted in excessively large process monitor circuits.

Yet another problem encountered is the number of input and output lines required. While as much information as possible is desired from such circuits, they compete with the production circuit for a limited number of pin-outs on the package.

What is needed, therefore, is a digital process monitor circuit that requires relatively fewer gates and less of an increase in surface area on the wafer in order to accurately measure gate speeds as semiconductor device speeds increase, allows for independent measurement of NMOS and PMOS gates, and requires few pin-outs.

SUMMARY OF THE INVENTION

The above and other objects are met by a circuit for testing a semiconductor device. The circuit is responsive to a test signal, which is received by an input. An oscillator is formed on the semiconductor device, and it produces oscillator pulses when it is energized. The oscillator pulses have a frequency which corresponds to operational characteristics of the semiconductor device.

A control circuit responds to the test signal from the input, and energizes the oscillator for a predetermined length of time. The oscillator pulses from the oscillator are received and counted by a counter, which produces a count corresponding to the number of oscillator pulses received by the counter during the predetermined length of time. An output circuit produces an output corresponding to the count, which indicates at least one of the operational characteristics of the semiconductor device.

In a preferred embodiment the output circuit includes a comparator, which compares the count to a predetermined number. A first output is produced when the count is not equal to the predetermined number, and a second output is produced when the count is equal to the predetermined number.

In further preferred embodiments, the semiconductor device has NMOS gates, or in other words gates that are N doped, and PMOS gates, or in other words gates that are P doped, upon each of which at least one of the operational characteristics of the semiconductor device is based. A first oscillator is formed on the semiconductor device, and it produces first oscillator pulses when the first oscillator is energized, which pulses have a first frequency corresponding to operational characteristics of the semiconductor device. The first oscillator has at least one NMOS gate, having a switching frequency that fixes the first frequency of the first oscillator.

In like manner, a second oscillator is formed on the semiconductor device, and it produces second oscillator pulses when energized, which pulses have a second frequency corresponding to operational characteristics of the semiconductor device. The second oscillator has at least one PMOS gate, having a switching frequency that fixes the second frequency of the second oscillator.

In this embodiment the control circuit energizes each of the oscillators for a predetermined length of time, and the counter receives and counts the first and second oscillator pulses, and produces first and second counts, corresponding respectively to the number of first and second oscillator pulses received by the counter during the predetermined lengths of time.

The output circuit produces first and second outputs, corresponding to the first and second counts, for independently indicating exactly the operational characteristics of the NMOS gates and the PMOS gates of the semiconductor device. The output circuit provides the first and second outputs on a single output line.

In another embodiment, a circuit for testing a semiconductor device has an oscillator for producing pulses when energized. A control circuit receives a test signal, a clock signal having pulses, and a reset signal, and energizes the oscillator for a predetermined length of time in response to the test signal. A counter detects the pulses produced by the oscillator, and produces counter signals which indicate the number of pulses detected by the counter.

An output detector receives the counter signals from the counter, and produces an output signal when the counter signals indicate that the number of pulses detected is equal to a predetermined number. However, the number of pulses produced by the oscillator during the predetermined length of time is preferably less than the predetermined number. The control circuit provides the clock signal to the counter after the predetermined length of time, until the output signal indicates that the predetermined number of pulses has been detected. The control circuit resets the counter in response to the reset signal.

By subtracting the number of pulses in the clock signal sent to the counter from the predetermined number, the number of pulses produced by the oscillator during the predetermined length of time can be determined. Dividing this number of pulses by the predetermined length of time yields the frequency for the oscillator, which can then be used, together with information about the structure of the oscillator, to determine gate speed.

Thus, in a circuit according to the present invention, additional transistors do not need to be added in series to increase the time required for a signal to traverse a path. Instead, the number of pulses produced by an oscillator are counted to determine gate speed. Therefore, instead of an analog time measurement, a digital pulse measurement is used to determine gate speed. Shifting from an analog domain to a digital domain represents a fundamental change in gate speed testing embodied by the invention.

As technology develops, and device speed increases, more pulses are produced by the oscillator during the predetermined length of time, and the counter may be overrun. In this case, the predetermined length of time can be reduced, or the counter can be expanded, which doubles the predetermined number of pulses which can be detected with every bit added to the counter. This is an area savings over previous methods and monitors.

In preferred embodiments the oscillator is a ring oscillator having an odd number of at least three invertors. Each invertor preferably has two relatively weak gates of the same type, either P or N, and one relatively strong gate of the other type. Two ring oscillators may be used, one to test the speed of PMOS gates, in which the relatively weak gates would be P type, and the other to test the speed of NMOS gates, in which the relatively weak gates would be N type. In this embodiment the control circuit also receives first and second selection signals, which are used to cause the control circuit to select one of the first or second oscillators. Also in preferred embodiments, the counter is a ripple counter, and the output detector is an AND gate.

In a method of testing a semiconductor device according to the present invention, a ripple counter is reset, to prepare it to receive and count pulses. A first of two ring oscillators is selected. One of the ring oscillators, when selected and energized, produces pulses in proportion to PMOS gate speed, and the other ring oscillator, when selected and energized, produces pulses in proportion to NMOS gate speed.

The first selected ring oscillator is energized for a first predetermined length of time, and produces pulses which are counted by the ripple counter during the first predetermined length of time. Clock pulses are sent to the ripple counter at the end of the first predetermined length of time, until the ripple counter indicates, by providing a first output on a single line, that a first predetermined total number of clock pulses and pulses from the first selected ring oscillator have been counted.

The number of clock pulses sent to the ripple counter are counted, and subtracted from the first predetermined number to produce a first difference, which is divided by the first predetermined length of time to produce a first frequency. The ripple counter is then again reset, to prepare it for counting other pulses.

In a manner similar to that described above, a second of the two ring oscillators is selected and energized for a second predetermined length of time. The second selected and energized ring oscillator produces pulses, which are counted by the ripple counter during the second predetermined length of time. Clock pulses are sent to the ripple counter at the end of the second predetermined length of time, until the ripple counter indicates, by providing a second output on the single line, that a second predetermined total number of clock pulses and pulses from the second selected ring oscillator have been counted.

The number of clock pulses sent to the ripple counter are counted, and subtracted from the second predetermined number to produce a second difference, which is divided by the second predetermined length of time to produce a second frequency.

In preferred embodiments, the semiconductor device is scrapped when the first frequency is either below a first specified value, or above a second specified value. Similarly, the semiconductor device is scrapped when the second frequency is either below a third specified value, or above a fourth specified value. The semiconductor device is processed further when the first frequency is between the first and second specified values, and the second frequency is between the third and fourth specified values. In a most preferred embodiment the first predetermined time is the same as the second predetermined time, and the first predetermined number is the same as the second predetermined number.

BRIEF DESCRIPTION OF THE DRAWINGS

Further advantages of the invention will become apparent by reference to the detailed description of preferred embodiments when considered in conjunction with the following drawings, in which like reference numbers refer to like elements throughout the several views, and wherein.

DETAILED DESCRIPTION OF THE INVENTION

Figure 1:
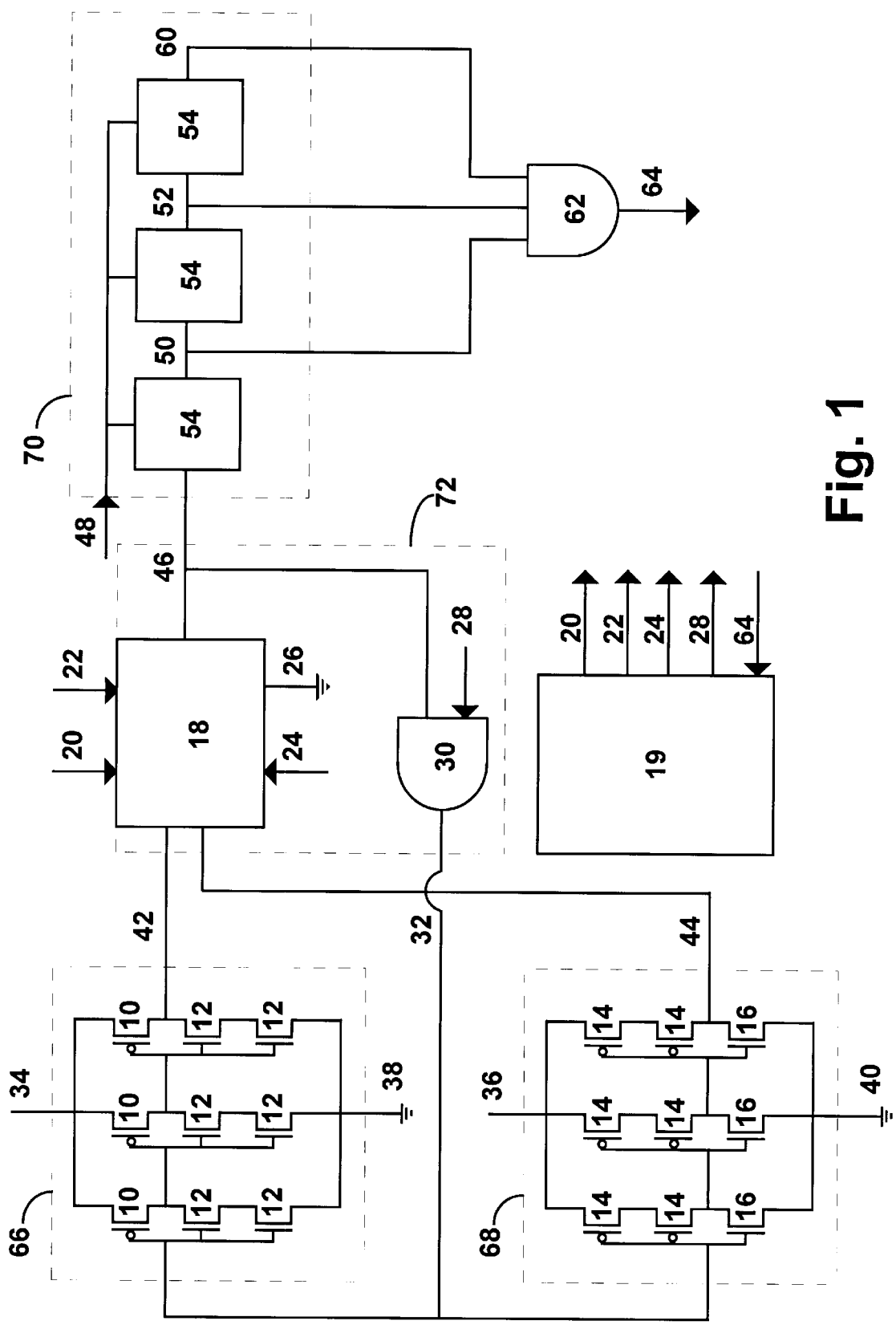
FIG. 1 is a functional block diagram of a first embodiment of a circuit according to the present invention.

Referring now to FIG. 1, there is depicted a preferred embodiment of the invention in the form of a functional block diagram. The major elements of the circuit are a control circuit 72, a counter 70, an output detector 62, a first oscillator 66, and a second oscillator 68. The function of each of these elements will be explained in greater detail below, as well as their construction and how they interact with one another. In the discussion which follows, electrically conductive paths from one element to another will be referred to as a line. However, it will be appreciated that in the various embodiments, one or more electrical paths may be utilized where only a single line is depicted.

The circuit depicted is preferably formed on a wafer having production dice, or in other words integrated circuits, using the same methods and processes of formation as those used to create the production dice. In this manner, when the test circuit is analyzed, the results will provide an indication of how the production dice will function under similar circumstances. Thus, an effective digital process monitor circuit is created.

The circuit depicted receives input from, and provides output to a test apparatus, such as tester 19. The tester 19 may be a dedicated tester having only the capability to perform the functions described hereafter, or more preferably is a programmable tester capable of performing the described functions in conjunction with many other functions. Testers such as models Vista Logic, Logic 100, or SC212 manufactured by Credence, Inc., or model J-921 manufactured by Teradyne, Inc., and other similar testers known in the art, are acceptable for the functions described herein.

Figure 2:
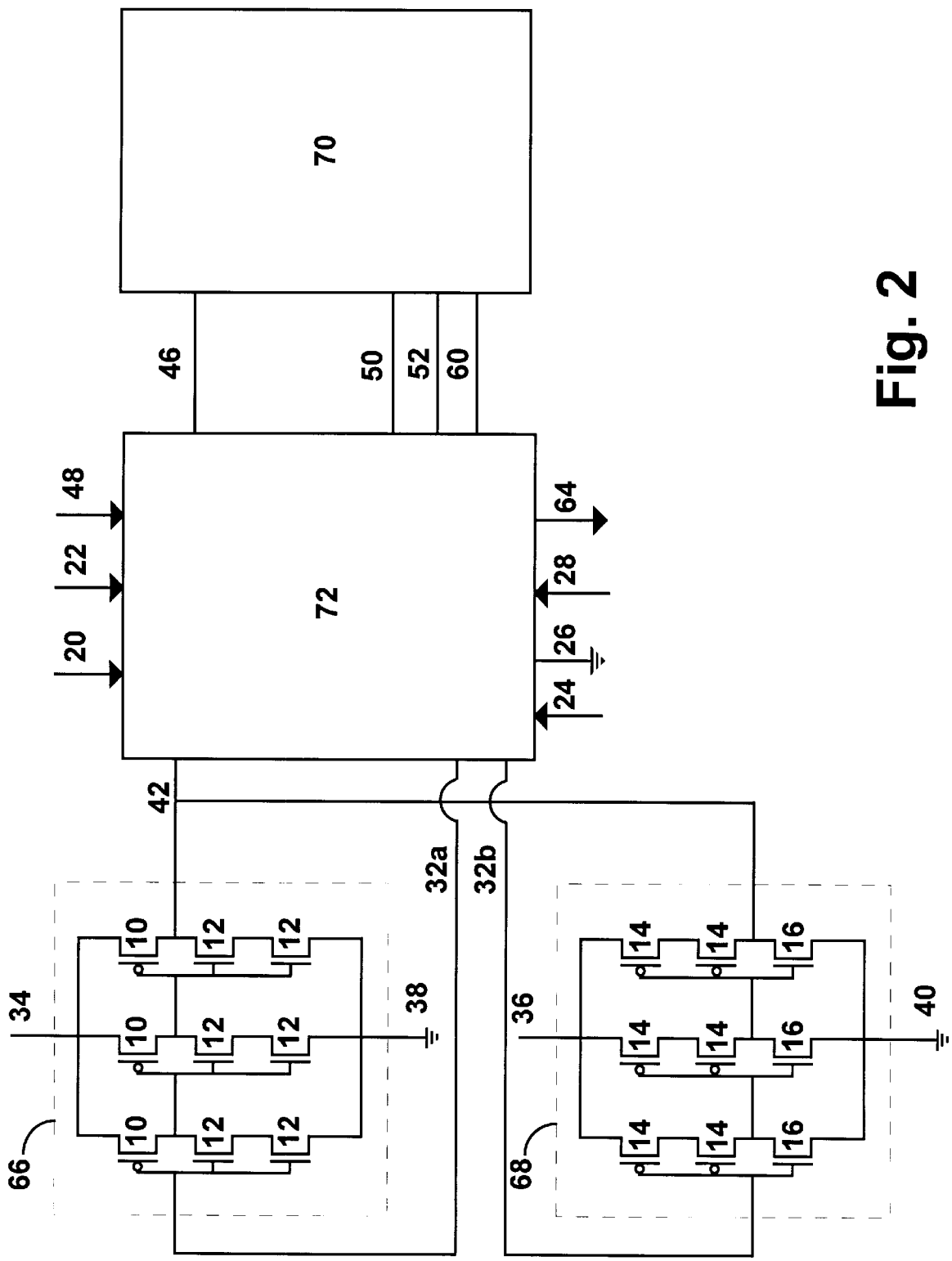
FIG. 2 is a functional block diagram of a second embodiment of a circuit according to the present invention

The input and output lines mentioned above will be briefly described here, and then their functions will be more fully explained hereafter. The control circuit 72 receives input from the tester 19 on lines 20, 22, 24, and 28. Lines 20 and 22 are selection lines, on which first and second selection signals are respectively received, and which are used to configure the control circuit 72 to receive input from either the first oscillator 66 or the second oscillator 68. The control circuit 72 receives a clock signal having pulses on line 24, and is grounded on line 26. On line 28 the circuit receives a test signal. The counter 70 is reset, or in other words zeroed, via line 48. The output of the circuit is provided to the tester 19 on line 64. In the embodiment of FIG. 2, all input and output is accomplished through control circuit 72.

The method is preferably commenced by resetting the counter 70 to zero by providing an input on line 48. By thus initializing the counter 70, the circuit is prepared to start the digital counting process that forms the basis of the method. The control circuit 72 is then configured via lines 20 and 22, to select and receive input from either first oscillator 66 or second oscillator 68. In the embodiment described below, first oscillator 66 will be first selected and energized. However, it will be appreciated that in alternate embodiments second oscillator 68 could be first selected and energized.

The control circuit 72 receives a test signal from the tester 19 on line 28, that persists for a first predetermined length of time. The test signal is received in the control circuit 72 by an element 30, which in the embodiment depicted is an AND gate, and passed out from the control circuit 72 on line 32. The test signal on line 32 is provided to both the first oscillator 66 and the second oscillator 68. However, as mentioned above, the control circuit 72 is only configured at this time to accept input from the first oscillator 66, which it receives on line 42. As depicted in FIG. 2 the test signal is only provided to the selected oscillator 66 or 68.

Oscillator 66 is depicted in this embodiment as a ring oscillator. The test signal provided on line 32 is received in parallel by a string of transistors which are connected in series, and which form an invertor. The invertor changes the logic state of the test signal. For example, if a high logic signal is received by the invertor, it produces a low logic signal as output. Oscillator 66 preferably produces as an output on line 42 a signal having the opposite logic state as the test signal received on line 32. Thus oscillator 66 preferably has an odd number of invertors in such embodiments. In the embodiment depicted there are three invertors.

Oscillator 66 is configured to propagate the test signal received on its input 32 to its output 42 with a delay. The delay is designed to be primarily the result of the switching speed, or gate speed, of NMOS gates. The actual length of the delay is not of primary importance, so long as it is accounted for in other design considerations for the circuit, as discussed in more detail below.

As can be seen in FIG. 1, the invertors of oscillator 66 each have two transistors 12 and one transistor 10. Transistors 10 have relatively strong PMOS gates. The two transistors 12 in each invertor string of the oscillator 66 have relatively weak NMOS gates. The gates are preferably made relatively weaker by narrowing the width of the gates, and are made relatively stronger by widening the width of the gates.

Because the PMOS transistors 10 have relatively strong gates, they will open an electrical path between the drains of transistors 10 more quickly, upon receipt of an appropriate signal, than will the transistors 12, which have relatively weak NMOS gates. Placing two of the relatively weak NMOS transistors 12 in series in each invertor string reduces the speed of propagating a signal through the oscillator 66 even further. Thus, most of the delay in propagating the test signal received on line 32 comes as a result of the NMOS transistors 12. Therefore, the number of pulses produced by oscillator 66 during a predetermined length of time will be primarily dependant on and in proportion to the speed of the NMOS gates. The circuit in this configuration can thus be used as a process monitor for NMOS gate speed.

During the length of the first predetermined length of time, the oscillator 66 produces alternating high and low logic output signals or pulses on line 42, which are received by the control circuit 72. The control circuit 72 passes these pulses on line 46 to the counter 70. The control circuit 72 may also, in a preferred embodiment, use the pulses passed on line 46 as a feedback loop to element 30, depicted as an AND gate, to regulate the test signals provided to the oscillator 66 on line 32.

The counter 70 counts the pulses received from the control circuit 72 on line 46. In the embodiment depicted in FIG. 1, the counter 70 is a ripple counter having three bits 54. However, it will be appreciated that this is for the purpose of illustration only, and in actual use counter 70 could be any other type of digital counter, and, if it were a ripple counter, would preferably have more than just three bits 54.

Further, the arrangement of the elements as described thus far is also merely a single embodiment of the present invention. For example, the control circuit 72 could provide the test signal to only oscillator 66 or oscillator 68, as depicted in FIG. 2, rather than to both at the same time, as depicted in FIG. 1. In this embodiment there are separate input lines to the oscillators 66 and 68, and the output lines from each tie into a single input line 42 to the control circuit 72. In a further alternate embodiment, the output from the oscillators 66 and 68 could go directly to the counter 70, without going back into the control circuit 72. Thus it is evident that several rearrangements of the elements of the invention are possible without departing from the spirit of the invention.

The counter 70 produces counter signals on lines 50, 52, and 60, which are received by an output detector 62, depicted in FIG. 1 as an AND gate. The purpose of the output detector 62 is to receive the counter signals and produce a single output signal when a first predetermined number is counted. In the embodiment as depicted in FIG. 1, the counter 70, with three bits, can count from zero to seven, and so seven would be the first predetermined number. Again, in actual use the counter 70 would preferably have the capacity for a first predetermined number that is greater than seven.

As mentioned previously, the test signal 28 provided to the circuit only lasts for a first predetermined length of time, during which the pulses produced by the oscillator 66 are counted by the counter 70. At the end of this first predetermined length of time, the test signal 28 is curtailed. At this point the counter 70 has preferably not been overrun, but has rather not yet counted to the first predetermined number.

If the counter 70 has been overrun, because, for example, the advance of process technology has made the gates of oscillator 66 switch faster than when the circuit was originally designed, then a test signal having a shorter first predetermined time can be supplied on line 28, allowing the oscillator 66 less time in which to cycle, and producing fewer pulses on line 42. Alternately, the counter 70 could be redesigned to have a higher capacity. Adding one bit 54 to counter 70 would double the first predetermined number. The ability to double the capacity of the counter by merely adding one bit provides the circuit with an enormous ability to adapt to faster gate speeds without a commensurately enormous addition of circuit elements.

A clock signal having pulses is provided by the tester 19 to the control circuit 72 on line 24. By using the first and second selection signals on lines 20 and 22, the clock pulses are provided to the counter 70 until the output detector 62 indicates that the first predetermined number has been attained by the counter 70. This means that the number of pulses produced by the oscillator 66, plus the number of pulses in the clock signal received on line 24, has equaled the first predetermined number.

By subtracting the number of clock pulses provided to the circuit on line 24 from the first predetermined number, a first difference is calculated, which represents the number of pulses produced by the oscillator 66 during the first predetermined length of time. Dividing the first difference by the first predetermined length of time produces a first frequency, which as described above is proportional to the switching speed of the NMOS gates.

The first frequency can then be compared to tolerance limits related to the design of the specific production dice located on the wafer with the process monitor circuit. For example, if the first frequency is below a first specified value, or above a second specified value, it could be scrapped. However, if the first frequency is between the first and second specified values, then further processing of the semiconductor devices on the wafer could be accomplished.

However, because the process monitor circuit of the present invention is capable of producing an exact value for the first frequency, this value can be stored in a database with other values similarly measured for other circuits. The compiled data in the database can then be formed into a distribution chart which, when correlated with other process data, can provide the process engineers responsible for maintaining the process, and others, with valuable and detailed information about the process characteristics and capabilities.

The output detector 62 provides the output signal on the single output line 64. Thus a circuit according to the present invention requires only a single output line, and yet can provide information to the tester 19 sufficient for the tester 19 to determine the exact frequency of operation of the oscillator 66, and thus the exact switching speed of the NMOS gates 12.

In a preferred embodiment, the speed of the PMOS gates is also tested, by configuring the control circuit 72 via the first and second selection signals on lines 20 and 22 to receive input from the second oscillator 68. The counter 70 is reset using line 48, and a test signal lasting for a second predetermined length of time is provided the control circuit 72 on line 28.

Second oscillator 68 works in the same manner as first oscillator 66, by producing pulses on line 44 having opposite logic state as the test signal receive on line 32. Thus, oscillator 68 will also have an odd number of invertors in such embodiments, and as with oscillator 66, is depicted with three invertors. However, oscillator 68 has two relatively weak PMOS transistors 14 in each invertor string, and one relatively strong NMOS transistor 16 in each invertor string. Thus, most of the delay in propagating the test signal received on line 32 comes as a result of the PMOS transistors 14. Therefore, the number of pulses produced by oscillator 68 during a predetermined length of time will be primarily dependant on and in proportion to the speed of the PMOS gates. The circuit in this configuration can thus be used as a process monitor for PMOS gate speed.

The counter 70 will then count the number of pulses produced by the oscillator 68 during the second predetermined length of time, in a manner similar to that described above. At the end of the second predetermined length of time, the test signal on line 28 is curtailed, and the pulses in the clock signal are received by the control circuit 72 on line 24. The counter 70 counts both the number of pulses from the oscillator 68 and the clock pulses, and when a second predetermined number is attained, output detector 62 provides an output signal on line 64.

Thus a circuit according to the present invention requires only a single output line 64 on which it can provide information to the tester 19 sufficient for the tester 19 to determine the exact frequency of operation of both the oscillator 66 and the oscillator 68, from which characteristics of the production circuits, such as the exact switching speeds of NMOS and PMOS gates, can be independently determined. Because only a single output line 64 is required, the process monitor circuit does not unduly compete with the production circuit for pin-outs in the finished package, and thus may be integrated with a semiconductor device, such as a CMOS device.

As depicted in FIG. 1, the first predetermined number and the second predetermined are the same number, as the same counter 70 and output detector 62 are used. However, in alternate embodiments, such as depicted in FIG. 2, where a different type of counter 70 is used, or where an output detector 62 that is configurable is used, the first and second predetermined numbers may be different numbers.

As before, when the second predetermined number is attained, the number of clock pulses is subtracted from it to yield a second difference. The second difference is divided by the second predetermined length of time to produce a second frequency. The second frequency is proportional to the switching speed of the PMOS gates, as mentioned above.

The second frequency can then be compared to tolerance limits related to the design of the specific production dice located on the wafer with the process monitor circuit. For example, if the second frequency is below a third specified value, or above a fourth specified value, it could be scrapped. However, if the second frequency is between the third and fourth specified values, then further processing of the semiconductor devices on the wafer could be accomplished.

However, as before, the detailed nature of the value for the second frequency can be further used in other ways, as described briefly for the first frequency, such as in trend charts for quality control methods.

Table 1 provides a summary of one possible embodiment for the interaction between the input lines 28, 24, 20, 22, and 48 of the circuit.

TABLE 1

| Line # Function | 28 Pulse | 24 Clock | 20 S1 | 22 S2 | 48 Reset | Operation |
|---|---|---|---|---|---|---|
| | n/a | n/a | n/a | n/a | 1 | Reset Ctr 70 |
| | 1 | n/a | 1 | 0 | 0 | Count Osc. 66 |
| | n/a | 1 | 0 | 0 | 0 | Count Clk Sig |
| | n/a | n/a | n/a | n/a | 1 | Reset Ctr 70 |
| | 1 | n/a | 0 | 1 | 0 | Count Osc. 68 |
| | n/a | 1 | 0 | 0 | 0 | Count Clk Sig |

For example, when a signal is sent on line 48, the counter 70 is reset, regardless of whatever signals may be on the other lines. Then a high first selection signal is given on line 20 and a low second selection signal is given on line 22, for example, to select the first oscillator 66, which is energized by the signal provided on line 28, and produces pulses which are counted by the counter 70. As lines 20 and 22 have configured the control circuit 72 to receive input from the first oscillator 66, it does not matter if pulses are sent in a clock signal on clock line 24.

Next, low first and second selection signals are sent on lines 20 and 22, and clock pulses are sent on line 24, which are counted by the counter 70, until the first predetermined number is attained, and an output signal is sent to the tester 19 on the single output line 64. The process is then repeated for the second oscillator 68, by resetting the counter 70, and selecting the second oscillator 68 by, for example, setting the first selection signal low on line 20 and setting the second selection signal high on line 22.

While specific embodiments of the invention have been described with particularity above, it will be appreciated that the invention is equally applicable to other processes and is capable of numerous modifications and substitutions of parts and steps without departing from the scope of the invention.

What is claimed is:

1. A circuit responsive to a test signal, for testing a semiconductor device, comprising:

an input for receiving the test signal, an oscillator formed on the semiconductor device for producing oscillator pulses, when the oscillator is energized, having a frequency corresponding to operational characteristics of the semiconductor device, a control circuit for responding to the test signal from the input and energizing the oscillator for a predetermined length of time, a counter for receiving and counting the oscillator pulses from the oscillator and producing a count corresponding to the number of oscillator pulses received by the counter during the predetermined length of time, and an output circuit for producing an output corresponding to the count indicating at least one of the operational characteristics of the semiconductor device.

2. The circuit of claim 1 wherein the output circuit comprises a comparator for comparing the count to a predetermined number, for producing a first output when the count is not equal to the predetermined number and for producing a second output when the count is equal to the predetermined number.

3. The circuit of claim 1 further comprising:

the semiconductor device having NMOS gates, upon which at least one of the operational characteristics is based, and the oscillator having at least one NMOS gate having a switching frequency that fixes the frequency of the oscillator, whereby the count indicates the switching frequency of the NMOS gate and thereby indicates the at least one operational characteristic of the NMOS gates of the semiconductor device.

4. The circuit of claim 1 further comprising:

the semiconductor device having PMOS gates, upon which at least one of the operational characteristics is based, and the oscillator having at least one PMOS gate having a switching frequency that fixes the frequency of the oscillator, whereby the count indicates the switching frequency of the PMOS gate and thereby indicates the at least one operational characteristic of the PMOS gates of the semiconductor device.

5. A circuit responsive to test signals, for testing a semiconductor device, comprising:

an input for receiving the test signals, a first oscillator formed on the semiconductor device for producing first oscillator pulses, when the first oscillator is energized, having a first frequency corresponding to operational characteristics of the semiconductor device, the first oscillator having at least one NMOS gate having a switching frequency that fixes the first frequency of the first oscillator, the semiconductor device having NMOS gates, upon which at least one of the operational characteristics is based, a second oscillator formed on the semiconductor device for producing second oscillator pulses, when the second oscillator is energized, having a second frequency corresponding to operational characteristics of the semiconductor device, the second oscillator having at least one PMOS gate having a switching frequency that fixes the second frequency of the second oscillator, the semiconductor device having PMOS gates, upon which at least one of the operational characteristics is based, a control circuit for responding to the test signals from the input and energizing each of the oscillators for a predetermined length of time, a counter for receiving and counting the first and second oscillator pulses from the first and second oscillators and producing first and second counts corresponding to the number of first and second oscillator pulses, respectively, received by the counter during the predetermined lengths of time, and an output circuit for producing first and second outputs corresponding to the first and second counts for independently indicating exactly the operational characteristics of the NMOS gates and the PMOS gates of the semiconductor device, and for providing the first and second outputs on a single output line.

6. The circuit of claim 5 further comprising:

the operational characteristics to which the first frequency corresponds being NMOS gate speed, and the operational characteristics to which the second frequency corresponds being PMOS gate speed.

7. A circuit for testing a semiconductor device comprising:

an oscillator for producing pulses when energized, a control circuit for receiving a test signal, a clock signal having pulses, and a reset signal, the control circuit for energizing for a predetermined length of time the oscillator in response to the test signal, a counter for detecting the pulses produced by the oscillator and producing counter signals indicating the number of pulses detected, the control circuit for resetting the counter in response to the reset signal, an output detector for receiving the counter signals and producing an output signal when the counter signals indicate that the number of pulses detected is equal to a predetermined number, and the control circuit for providing the clock signal to the counter after the predetermined length of time, until the output signal indicates that the predetermined number of pulses has been detected.

8. The circuit of claim 7 wherein the oscillator further comprises a ring oscillator having an odd number of at least three invertors.

9. The circuit of claim 8 wherein each invertor has two PMOS gates and one NMOS gate.

10. The circuit of claim 9 wherein the two PMOS gates are relatively weaker than the one NMOS gate.

11. The circuit of claim 8 wherein each invertor has two NMOS gates and one PMOS gate.

12. The circuit of claim 11 wherein the two NMOS gates are relatively weaker than the one PMOS gate.

13. The circuit of claim 7 wherein the counter further comprises a ripple counter.

14. The circuit of claim 7 wherein the output detector further comprises an AND gate.

15. A circuit for testing a semiconductor device comprising:

a first ring oscillator for measuring switching speed of PMOS gates and producing pulses when selected and energized, a second ring oscillator for measuring switching speed of NMOS gates and producing pulses when selected and energized, a control circuit for receiving a test signal, a clock signal having pulses, a first selection signal, a second selection signal, and a reset signal, the control circuit for selecting one of the first ring oscillator and the second ring oscillator in response to the first selection signal and the second selection signal, the control circuit for energizing for a predetermined length of time the selected one of the first ring oscillator and the second ring oscillator in response to the test signal, a ripple counter for detecting the pulses produced by the selected one of the first ring oscillator and the second ring oscillator and producing counter signals indicating the number of pulses detected, the control circuit for resetting the ripple counter in response to the reset signal, an AND gate for receiving the counter signals and producing an output signal on a single output line when the counter signals indicate that the number of pulses detected is equal to a predetermined number, and the control circuit for providing the clock signal to the ripple counter after the predetermined length of time, until the output signal indicates that the predetermined number of pulses has been detected.

16. The circuit of claim 15 wherein the first ring oscillator further comprises an odd number of at least three invertors.

17. The circuit of claim 16 wherein each invertor has two PMOS gates and one NMOS gate.

18. The circuit of claim 17 wherein the two PMOS gates are relatively weaker than the one NMOS gate.

19. The circuit of claim 15 wherein the second ring oscillator further comprises an odd number of at least three invertors.

20. The circuit of claim 19 wherein each invertor has two NMOS gates and one PMOS gate.

21. The circuit of claim 20 wherein the two NMOS gates are relatively weaker than the one PMOS gate.

22. A packaged CMOS semiconductor device of the type having NMOS gates having a gate speed and PMOS gates having a gate speed, the improvement comprising an integrated process monitor circuit having:

an input for receiving test signals, a first oscillator for producing first oscillator pulses when the first oscillator is energized, having at least one NMOS gate having a switching frequency that fixes a first frequency of the first oscillator, the first frequency corresponding to the NMOS gate speed of the CMOS semiconductor device, a second oscillator for producing second oscillator pulses when the second oscillator is energized, having at least one PMOS gate having a switching frequency that fixes a second frequency of the second oscillator, the second frequency corresponding to the PMOS gate speed of the CMOS semiconductor device, a control circuit for responding to the test signals from the input and energizing the oscillators for a predetermined length of time, a counter for receiving and counting the first and second oscillator pulses from the first and second oscillators and producing first and second counts corresponding to the number of first and second oscillator pulses, respectively, received by the counter during the predetermined length of time, and an output circuit for producing first and second outputs corresponding to the first and second counts for independently indicating exactly the NMOS gate speed and the PMOS gate speed of the CMOS semiconductor device, and for providing the first and second outputs on a single output line.

23. A circuit for testing a semiconductor device comprising:

a tester for providing a test signal, clock pulses, and a reset signal, an oscillator for producing pulses when energized, a control circuit for receiving the test signal, the clock pulses, and the reset signal, the control circuit for energizing for a predetermined length of time the oscillator in response to the test signal, a counter for detecting the pulses produced by the oscillator and producing counter signals indicating the number of pulses detected, an output detector for receiving the counter signals and producing an output signal when the counter signals indicate that the number of pulses detected is equal to a predetermined number, the control circuit for providing the clock pulses to the counter after the predetermined length of time, until the output signal indicates that the predetermined number of pulses has been detected, the tester for counting the clock pulses provided to the counter by the control circuit to produce a number of clock pulses, for subtracting the number of clock pulses from the predetermined number to produce a difference, and for dividing the difference by the predetermined length of time to produce a frequency, and the control circuit for resetting the counter in response to the reset signal.

24. A method of testing a semiconductor device comprising:

resetting a counter, energizing an oscillator for a predetermined length of time, producing pulses with the energized oscillator, counting the pulses produced with the energized oscillator within the predetermined length of time using the counter, sending clock pulses to the counter at the end of the predetermined length of time, until the counter indicates that a predetermined total number of clock pulses and pulses from the oscillator have been counted, counting the clock pulses sent to the counter, subtracting the number of clock pulses sent to the counter from the predetermined number to produce a difference, dividing the difference by the predetermined length of time to produce a frequency, and evaluating the semiconductor device based on the frequency.

25. The method of claim 24 further comprising:

scrapping the semiconductor device when the frequency is below a first specified value, scrapping the semiconductor device when the frequency is above a second specified value, and processing the semiconductor device further when the frequency is between the first and second specified values.

26. A method of testing a semiconductor device comprising:

resetting a ripple counter, selecting a first of two ring oscillators, one of which produces pulses in proportion to PMOS gate speed when selected and energized, and the other of which produces pulses in proportion to NMOS gate speed when selected and energized, energizing the first selected ring oscillator for a first predetermined length of time, producing pulses with the first selected and energized ring oscillator, counting the pulses produced with the first selected and energized ring oscillator within the first predetermined length of time using the ripple counter, sending clock pulses to the ripple counter at the end of the first predetermined length of time, until the ripple counter indicates, by providing a first output on a single line, that a first predetermined total number of clock pulses and pulses from the first selected ring oscillator have been counted, counting the clock pulses sent to the ripple counter, subtracting the number of clock pulses sent to the ripple counter from the first predetermined number to produce a first difference, dividing the first difference by the first predetermined length of time to produce a first frequency, resetting the ripple counter, selecting a second of the two ring oscillators, energizing the second selected ring oscillator for a second predetermined length of time, producing pulses with the second selected and energized ring oscillator, counting the pulses produced with the second selected and energized ring oscillator within the second predetermined length of time using the ripple counter, sending clock pulses to the ripple counter at the end of the second predetermined length of time, until the ripple counter indicates, by providing a second output on the single line, that a second predetermined total number of clock pulses and pulses from the second selected ring oscillator have been counted, counting the clock pulses sent to the ripple counter, subtracting the number of clock pulses sent to the ripple counter from the second predetermined number to produce a second difference, and dividing the second difference by the second predetermined length of time to produce a second frequency.

27. The method of claim 26 further comprising:

scrapping the semiconductor device when the first frequency is below a first specified value, scrapping the semiconductor device when the first frequency is above a second specified value, processing the semiconductor device further when the first frequency is between the first and second specified values, scrapping the semiconductor device when the second frequency is below a third specified value, scrapping the semiconductor device when the second frequency is above a fourth specified value, and processing the semiconductor device further when the second frequency is between the third and fourth specified values.

28. The method of claim 26 wherein the first predetermined time is the same as the second predetermined time.

29. The method of claim 26 wherein the first predetermined number is the same as the second predetermined number.

* * * * *